(12) United States Patent
Venugopal et al.

(10) Patent No.: US 10,490,673 B2
(45) Date of Patent: Nov. 26, 2019

(54) INTEGRATION OF GRAPHENE AND BORON NITRIDE HETERO-STRUCTURE DEVICE

(71) Applicant: Texas Instruments Incorporated, Dallas, TX (US)

(72) Inventors: Archana Venugopal, Dallas, TX (US); Luigi Colombo, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/910,817

(22) Filed: Mar. 2, 2018

(65) Prior Publication Data

US 2019/0273166 A1    Sep. 5, 2019

(51) Int. Cl.
*H01L 29/49*    (2006.01)
*H01L 29/786*    (2006.01)
(Continued)

(52) U.S. Cl.
CPC .... *H01L 29/78696* (2013.01); *H01L 21/0254* (2013.01); *H01L 21/02527* (2013.01); *H01L 21/02614* (2013.01); *H01L 29/1606* (2013.01); *H01L 29/2003* (2013.01); *H01L 29/267* (2013.01); *H01L 29/45* (2013.01); *H01L 29/4908* (2013.01); *H01L 29/66742* (2013.01);
(Continued)

(58) Field of Classification Search
CPC ......... H01L 29/78696; H01L 29/78681; H01L 29/78684; H01L 29/66742; H01L 29/45; H01L 29/1606; H01L 29/2003; H01L 29/267; H01L 29/4908; H01L 29/66045; H01L 21/02527; H01L 21/0254
See application file for complete search history.

(56) References Cited

U.S. PATENT DOCUMENTS 6,531,749 B1 * 3/2003 Matsuki ............ H01L 21/28061
257/388
7,732,859 B2    6/2010 Anderson
(Continued)

OTHER PUBLICATIONS

Venugopal et al., "Integration of Graphene and Boron Nitride Hetero-Structure Device Over Semiconductor Layer", U.S. Appl. No. 15/910,854, filed Mar. 2, 2018.
(Continued)

*Primary Examiner* — Michael M Trinh
(74) *Attorney, Agent, or Firm* — Jacqueline J. Garner; Charles A. Brill; Frank D. Cimino

(57) ABSTRACT

A microelectronic device includes a gated graphene component. The gated graphene component has a graphitic layer containing one or more layers of graphene. The graphitic layer has a channel region, a first contact region adjacent to the channel region and a second contact region adjacent to the channel region. A patterned hexagonal boron nitride (hBN) layer is disposed on the graphitic layer above the channel region. A gate is located over the patterned hBN layer above the channel region. A first connection is disposed on the graphitic layer in the first contact region, and a second connection is disposed on the graphitic layer in the second contact region. The patterned hBN layer does not extend completely under the first connection or under the second connection. A method of forming the gated graphene component in the microelectronic device is disclosed.

20 Claims, 12 Drawing Sheets

(51) Int. Cl.
  *H01L 29/20* (2006.01)
  *H01L 29/267* (2006.01)
  *H01L 29/45* (2006.01)
  *H01L 29/66* (2006.01)
  *H01L 21/02* (2006.01)
  *H01L 29/16* (2006.01)

(52) U.S. Cl.
  CPC .. *H01L 29/78618* (2013.01); *H01L 29/78681* (2013.01); *H01L 29/78684* (2013.01); *H01L 21/0242* (2013.01); *H01L 21/02378* (2013.01); *H01L 21/02381* (2013.01); *H01L 21/02389* (2013.01); *H01L 21/02395* (2013.01); *H01L 21/02422* (2013.01); *H01L 21/02488* (2013.01)

(56) References Cited

U.S. PATENT DOCUMENTS

| | | | |
|---|---|---|---|
| 8,106,383 B2 | 1/2012 | Jenkins | |
| 8,445,893 B2 | 5/2013 | Meric | |
| 8,698,226 B2 * | 4/2014 | Jain | H01L 29/66977 257/317 |
| 8,728,880 B2 | 5/2014 | Chung | |
| 8,735,209 B2 * | 5/2014 | Meric | H01L 29/1606 257/E21.703 |
| 8,803,132 B2 | 8/2014 | Farmer | |
| 8,957,404 B2 | 2/2015 | Mehr | |
| 9,029,228 B2 | 5/2015 | Seacrist | |
| 9,327,982 B2 | 5/2016 | Kub | |
| 9,704,965 B1 * | 7/2017 | Cao | H01L 29/4966 |
| 9,793,214 B1 | 10/2017 | Venugopal | |
| 9,882,008 B2 | 1/2018 | Colombo et al. | |
| 10,304,967 B1 * | 5/2019 | Venugopal | H01L 29/78696 |
| 2010/0055464 A1 | 3/2010 | Sung | |
| 2010/0218801 A1 | 9/2010 | Sung | |
| 2011/0163298 A1 | 7/2011 | Sung | |
| 2011/0309334 A1 | 12/2011 | Kobayashi | |
| 2012/0138903 A1 | 6/2012 | Chung | |
| 2012/0286244 A1 | 11/2012 | Chiu | |
| 2013/0207080 A1 * | 8/2013 | Dimitrakopoulos | H01L 29/4908 257/24 |
| 2013/0302963 A1 | 11/2013 | Afzali-Ardakani et al. | |
| 2014/0291607 A1 * | 10/2014 | Kim | H01L 29/1606 257/9 |
| 2015/0364589 A1 | 12/2015 | Lee | |

OTHER PUBLICATIONS

Colombo et al., "Low Contact Resistance Graphene Device Integration", U.S. Appl. No. 15/496,814, filed Apr. 25, 2017.

* cited by examiner

INTEGRATION OF GRAPHENE AND BORON NITRIDE HETERO-STRUCTURE DEVICE

FIELD

This disclosure relates to the field of microelectronic devices. More particularly, this disclosure relates to graphene in microelectronic devices.

BACKGROUND

Graphene is a promising material for microelectronic devices. A commonly proposed architecture for a gated graphene component is a graphitic layer containing graphene on a substrate, with metal contacts on the graphene and a channel region in the graphene between the contacts. Integration of this component into a microelectronic device has been challenging, due to degradation of the graphene during processes to form the microelectronic devices.

SUMMARY

The present disclosure introduces a microelectronic device which includes a gated graphene component. The gated graphene component includes a graphitic layer containing one or more layers of graphene. The graphitic layer has a channel region, a first contact region adjacent to the channel region and a second contact region adjacent to the channel region. The gated graphene component includes a patterned hexagonal boron nitride (hBN) layer on the graphitic layer over the channel region, and a gate over the patterned hBN layer above the channel region. A first connection is disposed on the graphitic layer in the first contact region, and a second connection is disposed on the graphitic layer in the second contact region. The patterned hBN layer does not extend completely under the first connection or under the second connection. A method of forming the gated graphene component in the microelectronic device is disclosed.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a gated graphene component having a graphitic layer that contains one or more layers of graphene. The graphitic layer includes a channel region, a first contact region adjacent to the channel region and a second contact region adjacent to the channel region. The graphene extends from the channel region into the first contact region and the second contact region. The gated graphene component includes a patterned hexagonal boron nitride (hBN) layer on the graphitic layer over the channel region, and a gate over the patterned hBN layer above the channel region. A first connection is disposed on the graphitic layer in the first contact region, and a second connection is disposed on the graphitic layer in the second contact region. The patterned hBN layer does not extend completely under the first connection or completely under the second connection. A method of forming the gated graphene component in the microelectronic device is disclosed.

For the purposes of this disclosure, the term "lateral" is understood to refer to a direction parallel to a plane of the top surface of the substrate. Terms such as over, above, under, and below may be used in this disclosure. These terms should not be construed as limiting the position or orientation of a structure or element, but should be used to provide spatial relationship between structures or elements.

For the purposes of this disclosure, it will be understood that, if an element is referred to as being "on" another element, it may be directly on the other element, or intervening elements may be present. Similarly, if an element is referred to as being "adjacent to" another element, it may be directly adjacent to the other element, or intervening elements may be present.

Figure 1:
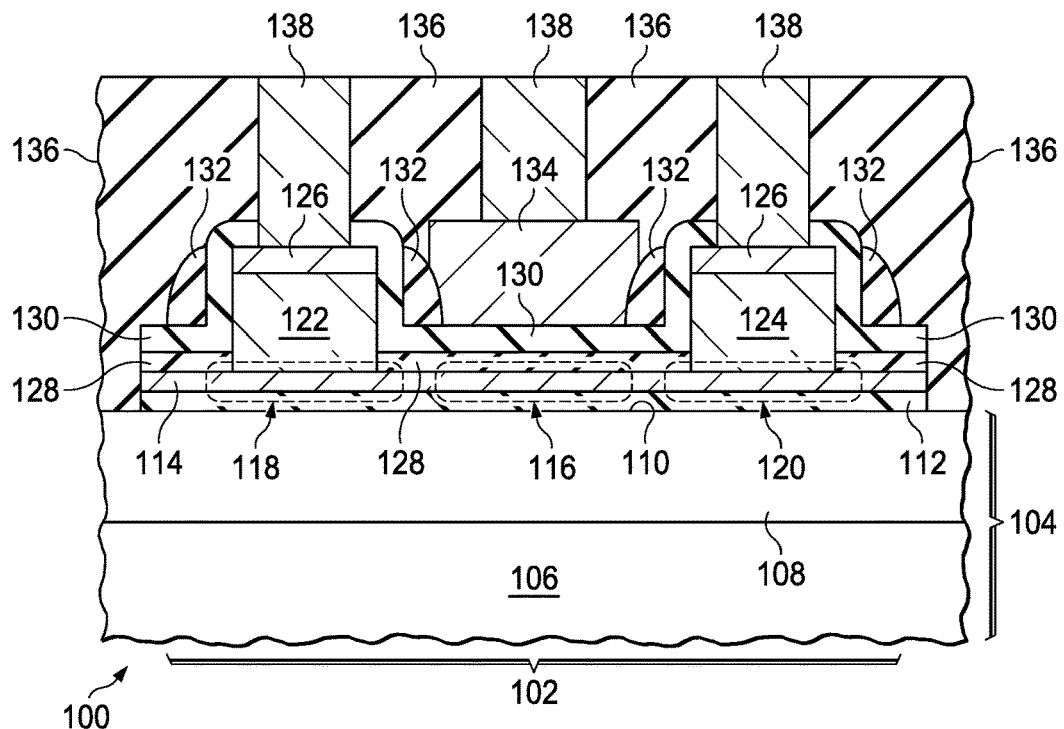
FIG. 1 is a cross section of an example microelectronic device which includes a gated graphene component.

FIG. 1 is a cross section of an example microelectronic device 100 which includes a gated graphene component 102. The microelectronic device 100 includes a substrate 104. The substrate 104 may be a portion of a semiconductor wafer, for example, a single crystal silicon wafer, possibly with an epitaxial layer, or a silicon on insulator (SOI) wafer, and may optionally include a semiconductor material 106, as depicted in FIG. 1. The substrate 104 may be a portion of a dielectric wafer such as a sapphire wafer or a glass wafer, free of semiconductor material. Other substrates suitable for the microelectronic device 100 are within the scope of the instant example. The substrate 104 includes a dielectric material 108 extending to a top surface 110 of the substrate 104. The dielectric material 108 may be a dielectric layer over the semiconductor material 106, as depicted in FIG. 1. The dielectric material 108 may be a top portion of a dielectric wafer providing the substrate 104.

The gated graphene component 102 of the instant example includes an optional lower hBN layer 112 over the top surface 110. The gated graphene component 102 includes a graphitic layer 114 over the top surface 110, on the lower hBN layer 112, if present. The graphitic layer 114 includes one or more layers of graphene. The graphitic layer 114 includes a channel region 116, a first contact region 118 adjacent to the channel region 116, and a second contact region 120 adjacent to the channel region 116. The graphene extends from the channel region 116 into the first contact region 118, and from the channel region 116 into the second contact region 120.

A first connection 122 is disposed on the graphitic layer 114 in the first contact region 118. A second connection 124 is disposed on the graphitic layer 114 in the second contact region 120. The first connection 122 and the second connection 124 provide electrical connections to the graphene in the graphitic layer 114. The first connection 122 and the second connection 124 may include metal, graphene, carbon nanotubes, or other electrically conductive material. Barrier caps 126 may be disposed over the first connection 122 and the second connection 124. The barrier caps 126 may include material such as titanium nitride or tantalum nitride, which inhibits diffusion of nitrogen and boron.

The gated graphene component 102 includes a patterned hBN layer 128 on the graphitic layer 114 over the channel region 116. The patterned hBN layer 128 does not extend completely under the first connection 122 or completely under the second connection 124. The patterned hBN layer 128 may optionally extend past the first connection 122 and the second connection 124, as shown in FIG. 1.

The gated graphene component 102 may include a gate dielectric layer 130 over the patterned hBN layer 128 above the channel region 116. The gate dielectric layer 130 may include silicon dioxide, silicon nitride, silicon oxynitride, hafnium oxide, zirconium oxide, tantalum oxide, or such. The gate dielectric layer 130 may be, for example, 1 nanometer to 10 nanometers thick.

The gated graphene component 102 may further include contact spacers 132 adjacent to lateral surfaces of the first connection 122 and the second connection 124. The contact spacers 132 do not extend over the channel region 116. The contact spacers 132 may include silicon dioxide, silicon nitride, or other dielectric materials. In the instant example, the gate dielectric layer 130 extends along the lateral surfaces of the first connection 122 and the second connection 124, so that the contact spacers 132 are separated from the first connection 122 and the second connection 124 by the gate dielectric layer 130. Other configurations of the contact spacers 132 and the gate dielectric layer 130, relative to the first connection 122 and the second connection 124, are within the scope of the instant example.

The gated graphene component 102 includes a gate 134 over the gate dielectric layer 130 above the channel region 116. The gate 134 may include one or more metals such as aluminum, copper, titanium, titanium nitride, tantalum, tantalum nitride, and tungsten, to provide a desired work function. The gate 134 is laterally separated from the first connection 122 and the second connection 124 by the contact spacers 132.

A dielectric layer 136 may be disposed over the gated graphene component 102 and the substrate 104. The dielectric layer 136 may be a pre-metal dielectric (PMD) layer 136 which includes one or more sub-layers of dielectric material, for example a PMD liner of silicon nitride, a layer of silicon dioxide-based material, a layer of phosphorus silicate glass (PSG) or boron phosphorus silicate glass (BPSG), and a cap layer of silicon nitride, silicon oxynitride, silicon carbide or silicon carbide nitride. Other structures and compositions for the dielectric layer 136 are within the scope of the instant example. Contacts 138 may be disposed through the dielectric layer 136 to provide electrical connections to the gate 134, the first connection 122, and the second connection 124. The contacts 138 may optionally make electrical connections to the first connection 122 and the second connection 124 through the barrier caps 126, as shown in FIG. 1.

During operation of the microelectronic device 100, current may be flowed from the first connection 122 through the graphene in the graphitic layer 114 to the second connection 124. The patterned hBN layer 128 may protect the graphitic layer 114 from degradation during fabrication and use of the microelectronic device 100, advantageously providing desired values of charge carrier mobility in the graphene through the channel region 116. The lower hBN layer 112, if present, may further advantageously protect the graphitic layer 114.

Figure 2A:
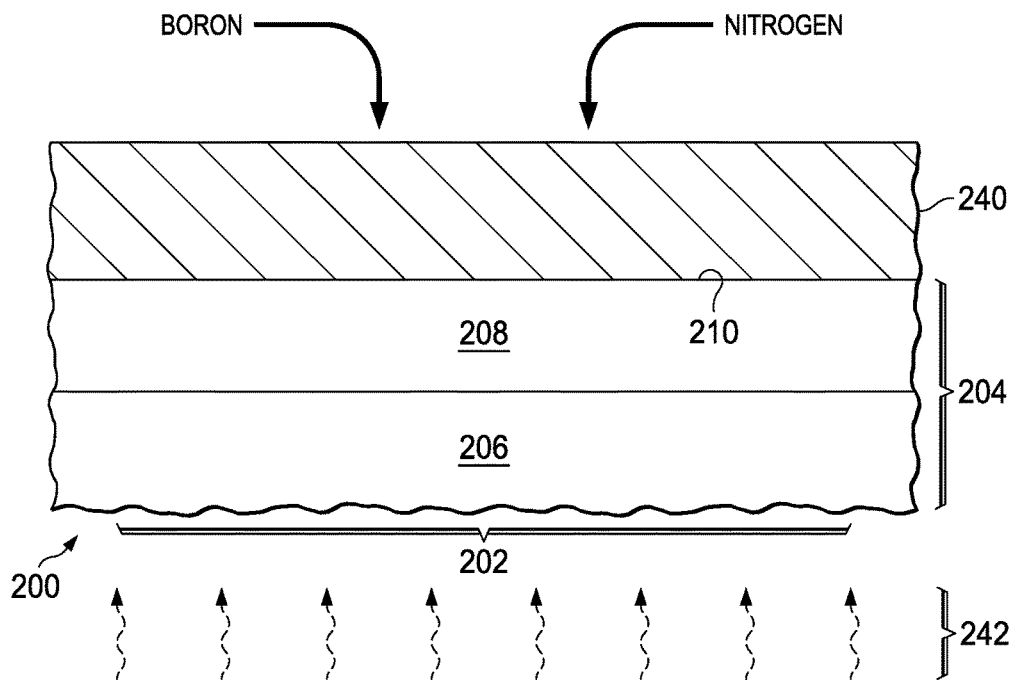
FIG. 2A through FIG. 2J are cross sections of a microelectronic device containing a gated graphene component, depicted in stages of an example method of formation.

FIG. 2A through FIG. 2J are cross sections of a microelectronic device 200 containing a gated graphene component 202, depicted in stages of an example method of formation. Referring to FIG. 2A, the microelectronic device 200 includes a substrate 204. The substrate 204 may be a semiconductor wafer, an SOI wafer, having a semiconductor material 206 such as silicon, silicon carbide, gallium arsenide, gallium nitride, or the like, as depicted in FIG. 2A. The substrate 204 may be a dielectric wafer such as a sapphire wafer or a glass wafer, free of semiconductor material.

The substrate 204 includes dielectric material 208 extending to a top surface 210 of the substrate 204. The dielectric material 208 may be part of a dielectric layer such as field oxide, formed over the semiconductor material 206, as depicted in FIG. 2A. The dielectric material 208 may be a top portion of a dielectric wafer providing the substrate 204.

A lower metal layer 240 is formed over the dielectric material 208. The lower metal layer 240 includes one or more metals suitable for subsequent precipitation of an hBN layer, for example, cobalt, nickel, copper, ruthenium, rhodium, palladium, silver, rhenium, iridium, platinum, gold, or any combination thereof. These metals are not an exhaustive list, and are provided by way of examples. The lower metal layer (240) may include a homogeneous alloy or mixture of two or more different metals. The lower metal layer (240) may include a layered structure of two or more layers with different metals, for example a copper/nickel/copper stack. The lower metal layer (240) may be formed, for example, by a sputter process, an evaporation process, a chemical vapor deposition (CVD) process, a metal organic chemical vapor deposition (MOCVD) process, or an atomic layer deposition (ALD) process. A thickness of the lower metal layer 240 is appropriate for precipitation of an hBN layer onto the dielectric material 208, and thus may be selected based on the composition of the lower metal layer 240. For example, the lower metal layer 240 may have a thickness of 50 nanometers to 500 nanometers. The lower metal layer 240 may be patterned, so as to extend only over the area for the gated graphene component 202. Alternately, the lower metal layer 240 may extend over the whole substrate 204, as depicted in FIG. 2A.

Boron, denoted as "Boron" in FIG. 2A, is introduced into the lower metal layer 240 in sufficient quantity to form a saturation condition of boron in the lower metal layer 240 at a temperature suitable for diffusion of the boron and the nitrogen in the lower metal layer 240 and precipitation of the hBN layer onto the dielectric material 208, for example, 400° C. to 800° C. Nitrogen, denoted as "Nitrogen" in FIG. 2A, is introduced into the lower metal layer 240 in sufficient quantity to form a saturation condition of nitrogen in the lower metal layer 240 at the same temperature suitable for diffusion of the boron and the nitrogen and precipitation of the hBN layer onto the dielectric material 208. The lower metal layer 240 may be heated by a first radiant heating process 242, as depicted schematically in FIG. 2A, or by another process such as a furnace process or a hot plate process. The boron and the nitrogen may be introduced into the lower metal layer 240 by any of several methods, including, for example, exposure to boron-containing gas reagents and nitrogen-containing gas reagents.

Figure 2B:
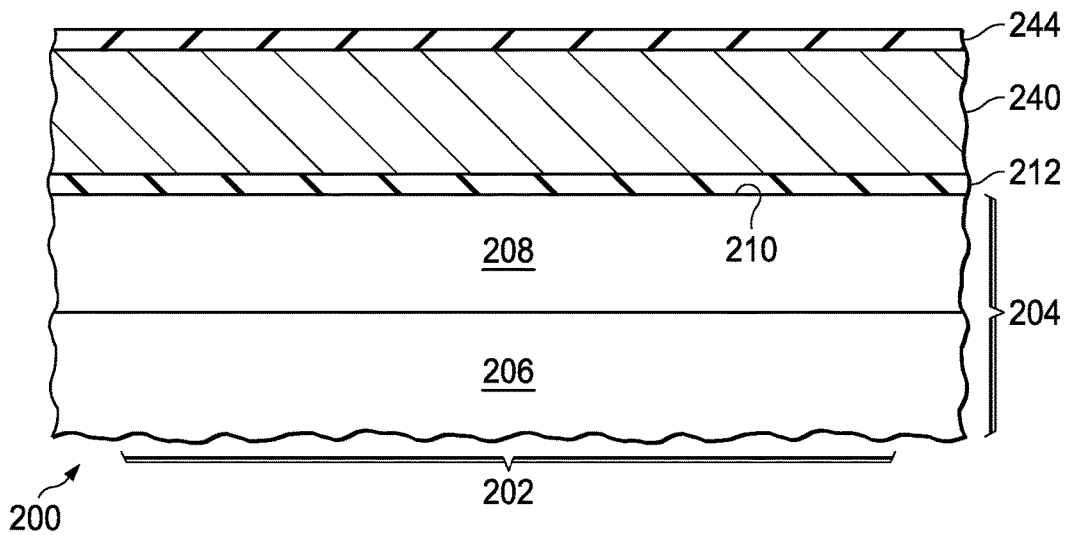

Referring to FIG. 2B, the lower metal layer 240 is subsequently cooled, resulting in diffusion of the boron and the nitrogen to surfaces of the lower metal layer 240 and precipitation of a lower hBN layer 212 on the top surface 210 of the dielectric material 208. A sacrificial hBN layer 244 may be precipitated on a top surface of the lower metal layer 240, opposite from the lower hBN layer 212. The sacrificial hBN layer 244 may be removed, for example by a light sputter etch, leaving a major portion of the lower metal layer 240 intact.

Figure 2C:
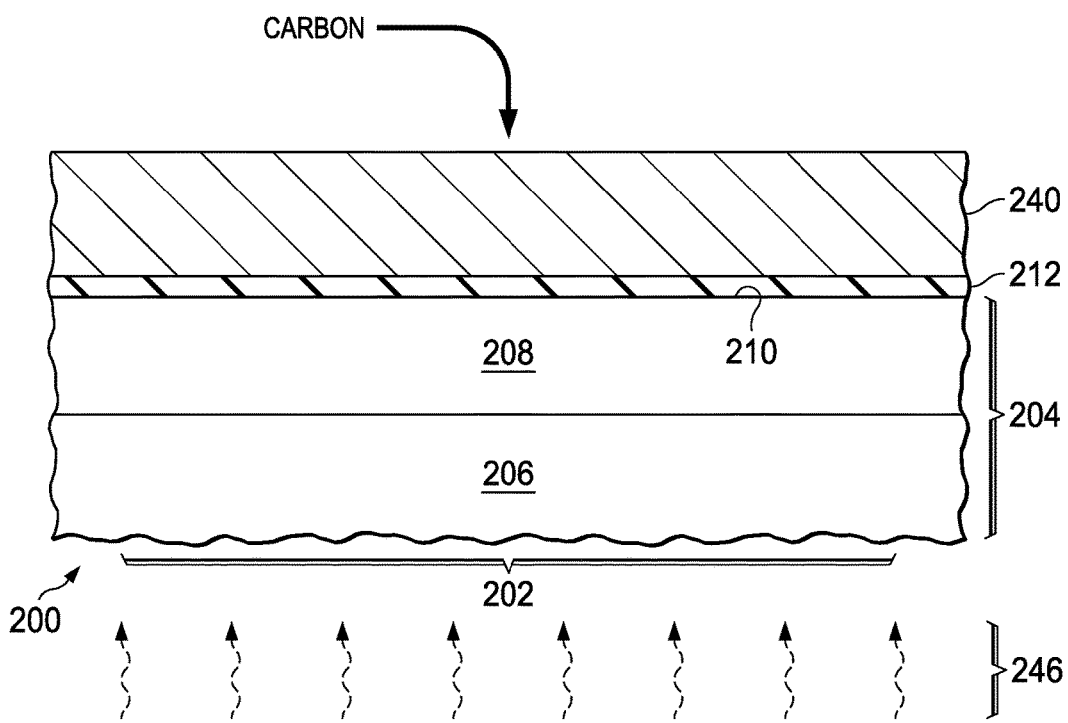

Referring to FIG. 2C, carbon, denoted as "Carbon" in FIG. 2C, is introduced into the lower metal layer 240 in sufficient quantity to form a saturation condition of carbon in the lower metal layer 240 at a temperature suitable for diffusion of the carbon in the lower metal layer 240 and precipitation of a graphitic layer onto the lower hBN layer 212, for example, 400° C. to 800° C. The lower metal layer 240 may be heated by a second radiant heating process 246, as depicted schematically in FIG. 2C, or by another process. The carbon may be introduced into the lower metal layer 240 by any of several methods, including, for example, exposure to carbon-containing gas reagents.

Figure 2D:
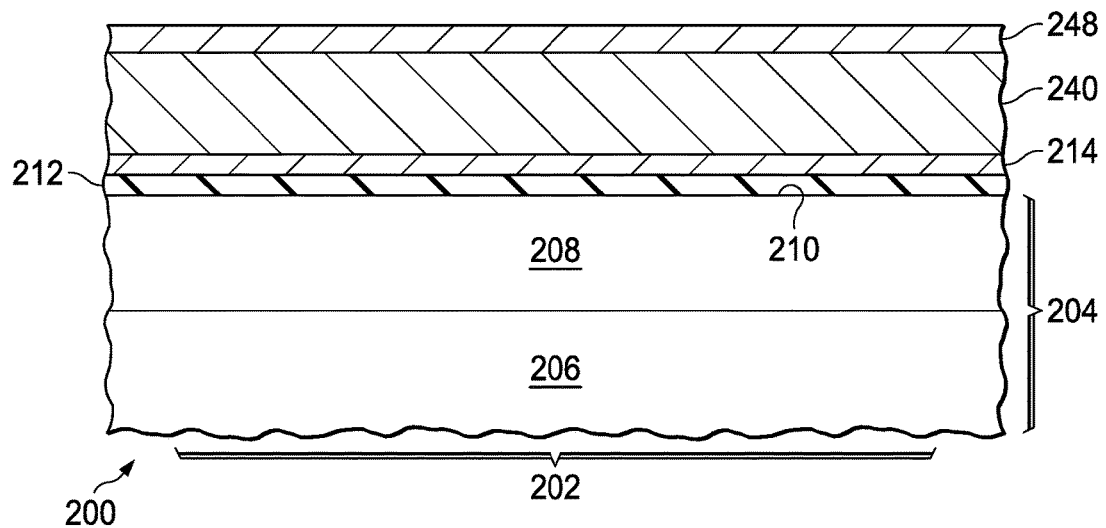

Referring to FIG. 2D, the lower metal layer 240 is subsequently cooled, resulting in diffusion of the carbon to surfaces of the lower metal layer 240 and precipitation of a graphitic layer 214 on the lower hBN layer 212. The graphitic layer 214 includes graphene and may have a Bernal configuration. A sacrificial graphitic layer 248 may also be precipitated on a top surface of the lower metal layer 240, opposite from the graphitic layer 214. The sacrificial graphitic layer 248 may optionally be removed. Use of the lower metal layer 240 to form both the lower hBN layer 212 and the graphitic layer 214 may advantageously reduce degradation of the lower hBN layer 212 compared to a method which removes the lower metal layer 240 after formation of the lower hBN layer 212 and forms a separate metal layer for precipitation of the graphitic layer 214.

Figure 2E:
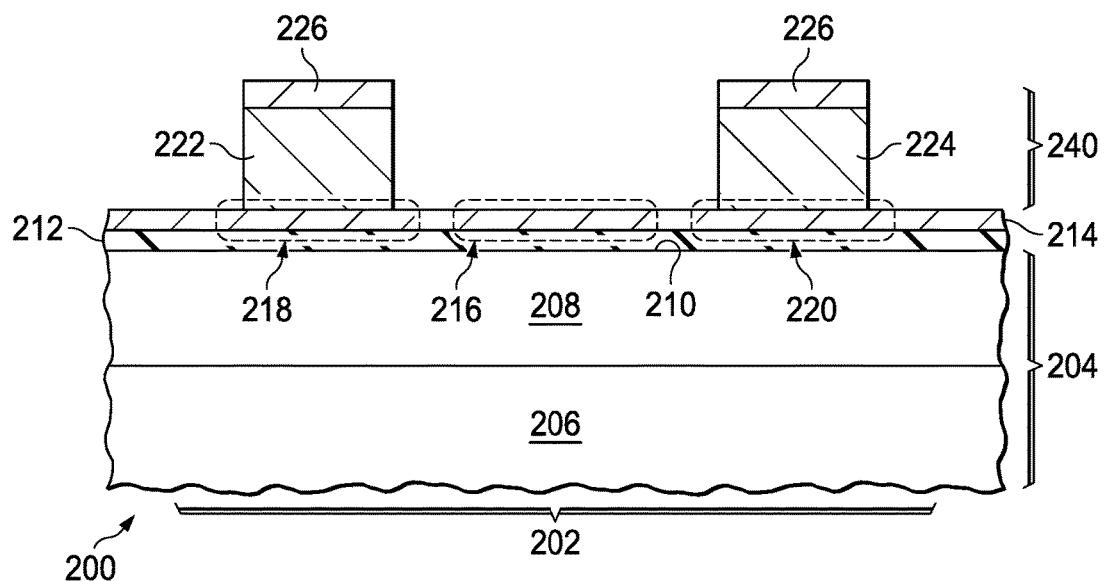

Referring to FIG. 2E, a layer of barrier material, not shown, is formed over the lower metal layer 240. The barrier material may include material such as titanium nitride or tantalum nitride, which inhibits diffusion of nitrogen and boron. The lower metal layer 240 and the overlying layer of barrier material are patterned concurrently to form a first connection 222 and a second connection 224 from the lower metal layer 240, and to form barrier caps 226 from the layer of barrier material.

The first connection 222 makes contact to the graphitic layer 214 in a first contact region 218 of the graphitic layer 214. The second connection 224 makes contact to the graphitic layer 214 in a second contact region 220 of the graphitic layer 214. The graphitic layer 214 has a channel region 216 adjacent to the first contact region 218 and adjacent to the second contact region 220. Use of the lower metal layer 240 to provide the first connection 222 and the second connection 224 may advantageously provide a lower contact resistance to the graphitic layer 214 compared to a method which removes the lower metal layer 240 and uses a separate metal layer to form the first connection 222 and the second connection 224.

Figure 2F:
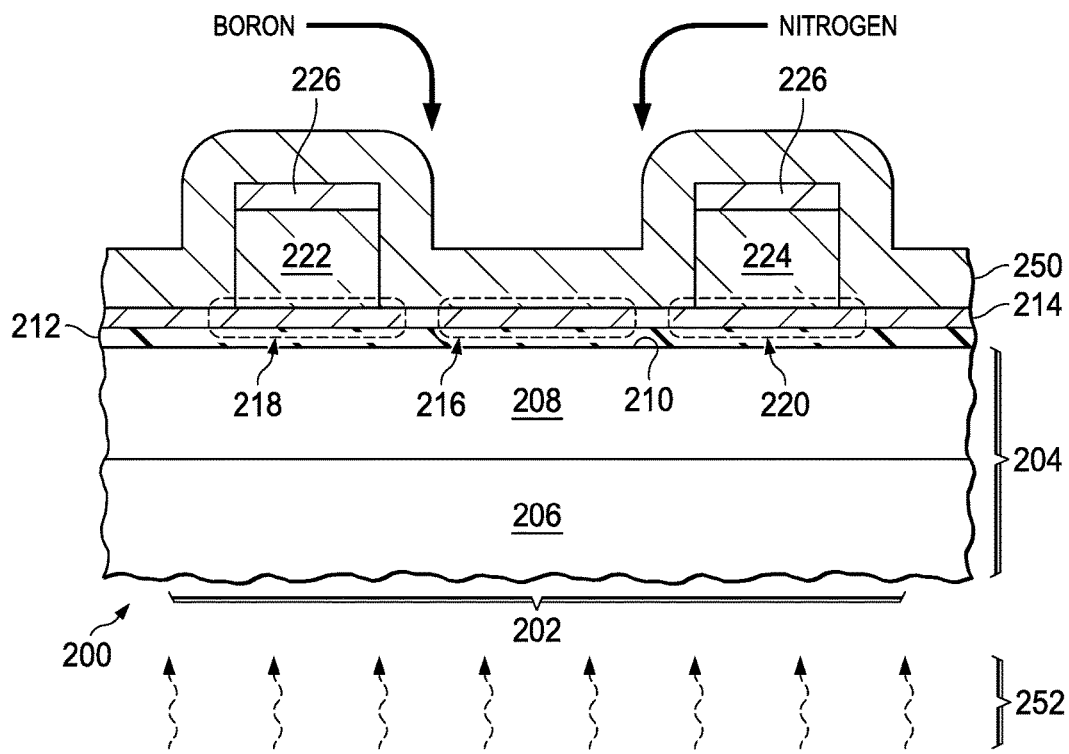

Referring to FIG. 2F, an upper metal layer 250 is formed on the graphitic layer 214 in the channel region 216, and optionally extending over the first connection 222 and the second connection 224, as depicted in FIG. 2F. The upper metal layer 250 includes one or more metals suitable for subsequent precipitation of an hBN layer. The upper metal layer 250 may have a structure and a composition similar to that disclosed for the lower metal layer 240 of FIG. 2A. The upper metal layer 250 may be formed by any of the processes disclosed in reference to the lower metal layer 240. Boron, denoted as "Boron" in FIG. 2F, and nitrogen, denoted as "Nitrogen" in FIG. 2F, are introduced into the upper metal layer 250 at a temperature suitable for diffusion of the boron and the nitrogen in the upper metal layer 250 and precipitation of the hBN layer onto the graphitic layer 214. The boron and the nitrogen may be introduced into the upper metal layer 250, for example, as disclosed in reference to FIG. 2A. The upper metal layer 250 may be heated to the desired temperature by a third radiant heating process 252, as depicted schematically in FIG. 2F or by another process. The barrier caps 226 block the boron and nitrogen from a major portion of the first connection 222 and the second connection 224.

Figure 2G:
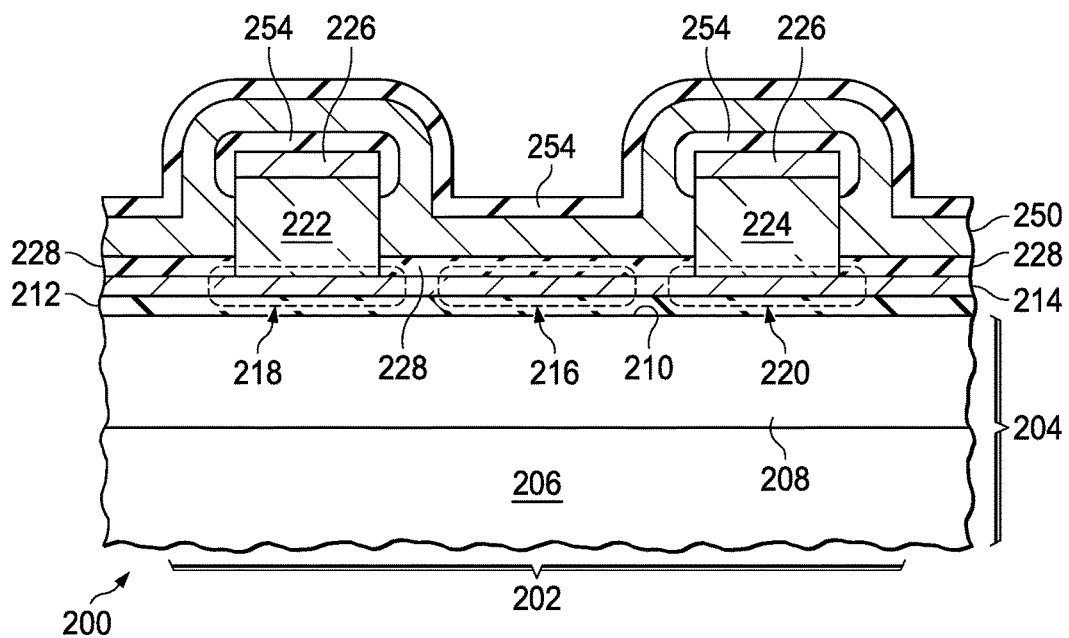

Referring to FIG. 2G, the upper metal layer 250 is subsequently cooled, resulting in diffusion of the boron and the nitrogen to surfaces of the upper metal layer 250 and precipitation of a patterned hBN layer 228 on the graphitic layer 214 opposite from the lower hBN layer 212. A sacrificial hBN layer 254 may be precipitated on a top surface of the upper metal layer 250, opposite from the lower hBN layer 212. Additional portions of the sacrificial hBN layer 254 may be precipitated on the barrier caps 226, as depicted in FIG. 2G. Further portions of the sacrificial hBN layer 254 may possibly be precipitated on lateral surfaces of the first connection 222 and the second connection 224, depending on conditions of an interface between the upper metal layer 250 and the first connection 222 and the second connection 224.

The upper metal layer 250 and the sacrificial hBN layer 254 are subsequently removed, leaving the patterned hBN layer 228 intact. The patterned hBN layer 228 does not extend completely under the first connection 222 or completely under the second connection 224, as a result of the boron and nitrogen of FIG. 2F being blocked by the barrier caps 226. The patterned hBN layer 228 may extend partway under the first connection 222 or partway under the second connection 224, as a result of diffusion of the boron and nitrogen through lateral surfaces of the first connection 222 or the second connection 224, which are not covered by the barrier caps 226.

Figure 2H:
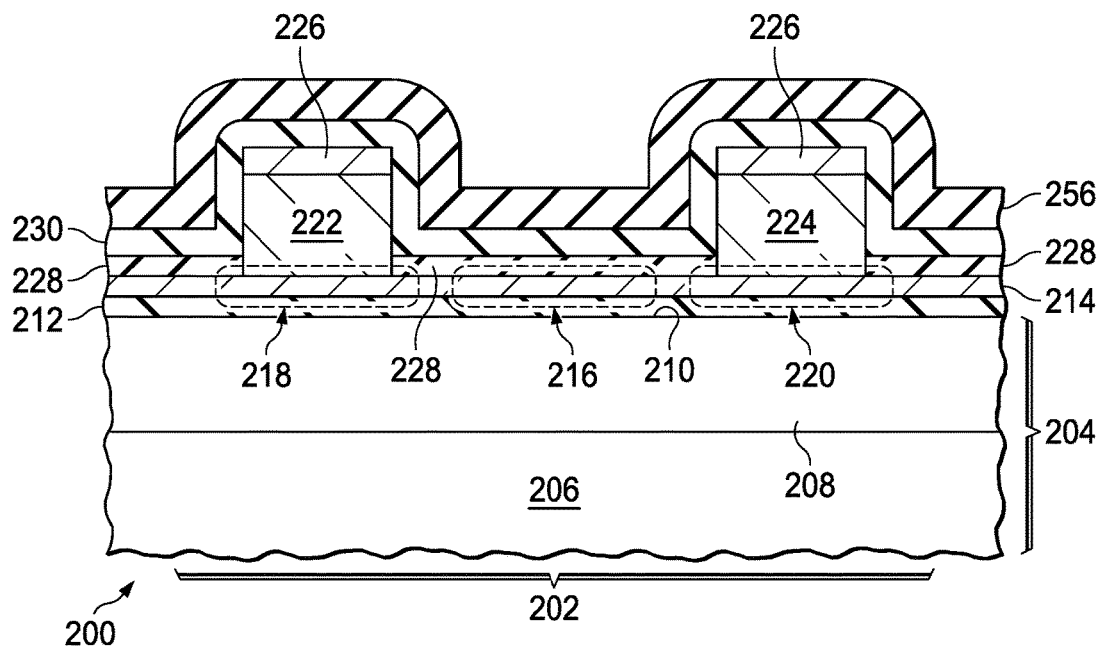

Referring to FIG. 2H, in the instant example, a gate dielectric layer 230 is formed over the patterned hBN layer 228. The gate dielectric layer 230 may extend over the first connection 222 and the second connection 224, as depicted in FIG. 2H. The gate dielectric layer 230 may have a composition and a structure as disclosed for the gate dielectric layer 130 of FIG. 1. The gate dielectric layer 230 may be formed, for example, by an ALD process, by a plasma enhanced chemical vapor deposition (PECVD) process, or by a CVD process.

In the instant example, a conformal spacer layer 256 is formed over the gate dielectric layer 230. The conformal spacer layer 256 may include, for example, silicon dioxide, silicon nitride, or silicon oxynitride. The conformal spacer layer 256 may be formed by a PECVD process, a low pressure chemical vapor deposition (LPCVD) process, or other process for forming a conformal layer of dielectric material.

Figure 2I:
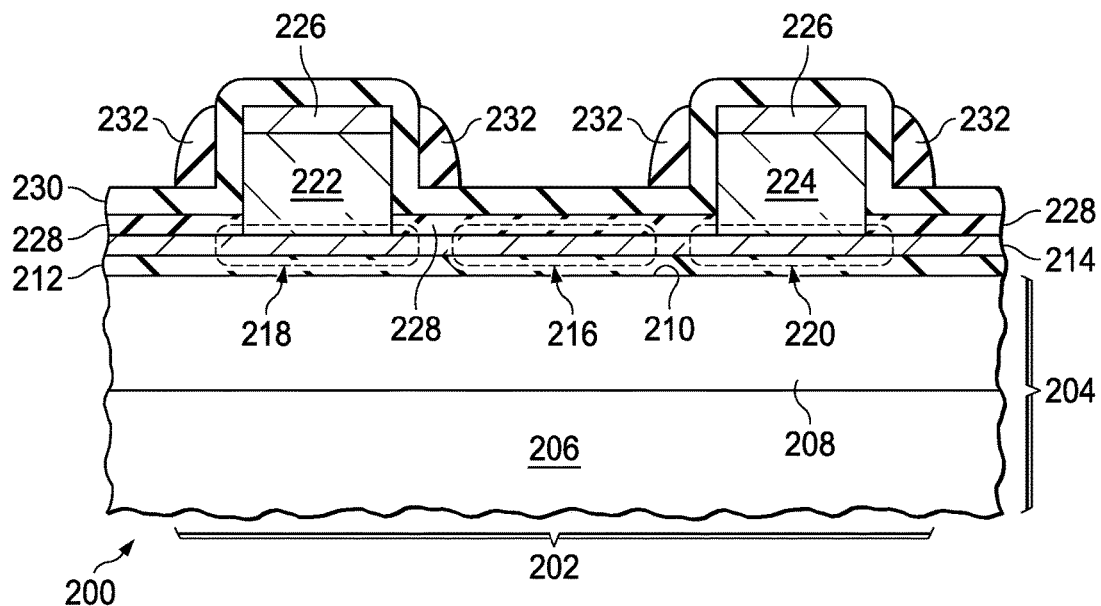

Referring to FIG. 2I, the conformal spacer layer 256 of FIG. 2H is etched by an anisotropic etch process so as to remove the conformal spacer layer 256 over the channel region 216 of the graphitic layer 214, leaving the conformal spacer layer 256 adjacent to lateral surfaces of the first connection 222 and the second connection 224, to provide contact spacers 232. The anisotropic process may include, for example, a reactive ion etch (RIE) process using fluorine radicals.

Figure 2J:
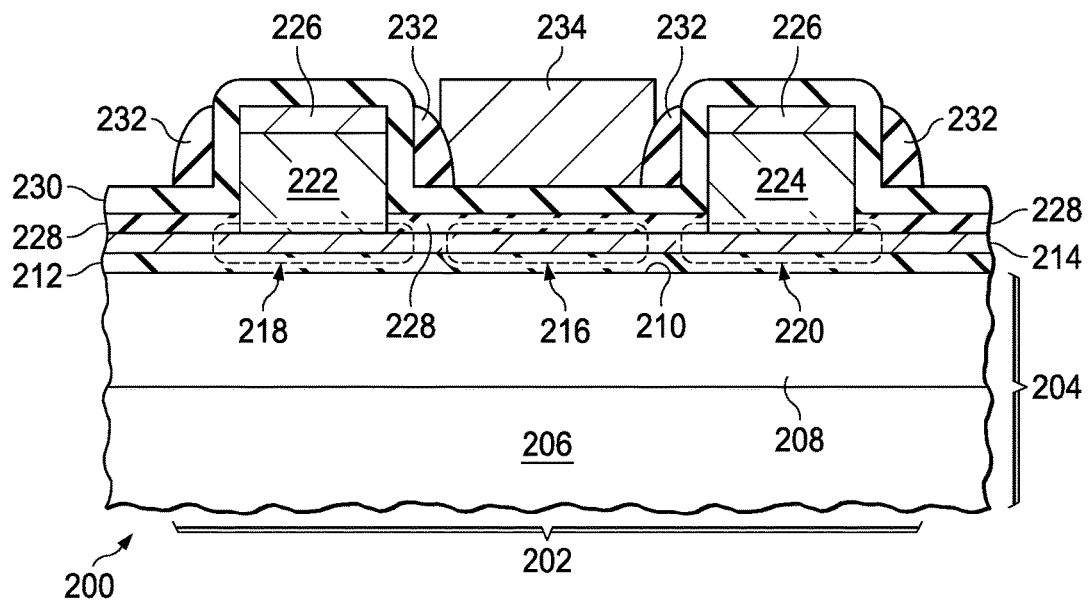

Referring to FIG. 2J, a gate 234 is formed over the gate dielectric layer 230 above the channel region 216. The gate 234 is laterally separated and electrically isolated from the first connection 222 and the second connection 224 by the contact spacers 232. The contact spacers 232 enable operation of the gate 234 at a desired potential relative to potentials on the first connection 222 and the second connection 224 to obtain a desired conductivity through the channel region 216 without leakage current from the gate 234 to the first connection 222 or the second connection 224. The gate 234 may have a composition as disclosed for the gate 134 of FIG. 1. The gate 234 may be formed by forming a layer of gate material over an existing top surface of the microelectronic device 200, forming an etch mask over the layer of gate material which covers an area for the gate 234, and removing the gate material where exposed by the etch mask.

Formation of the microelectronic device 200 may continue with formation of contacts, interconnects and supporting dielectric layers. The microelectronic device 200 of FIG. 2J may be further processed to provide a structure similar to the microelectronic device 100 of FIG. 1.

Figure 3:
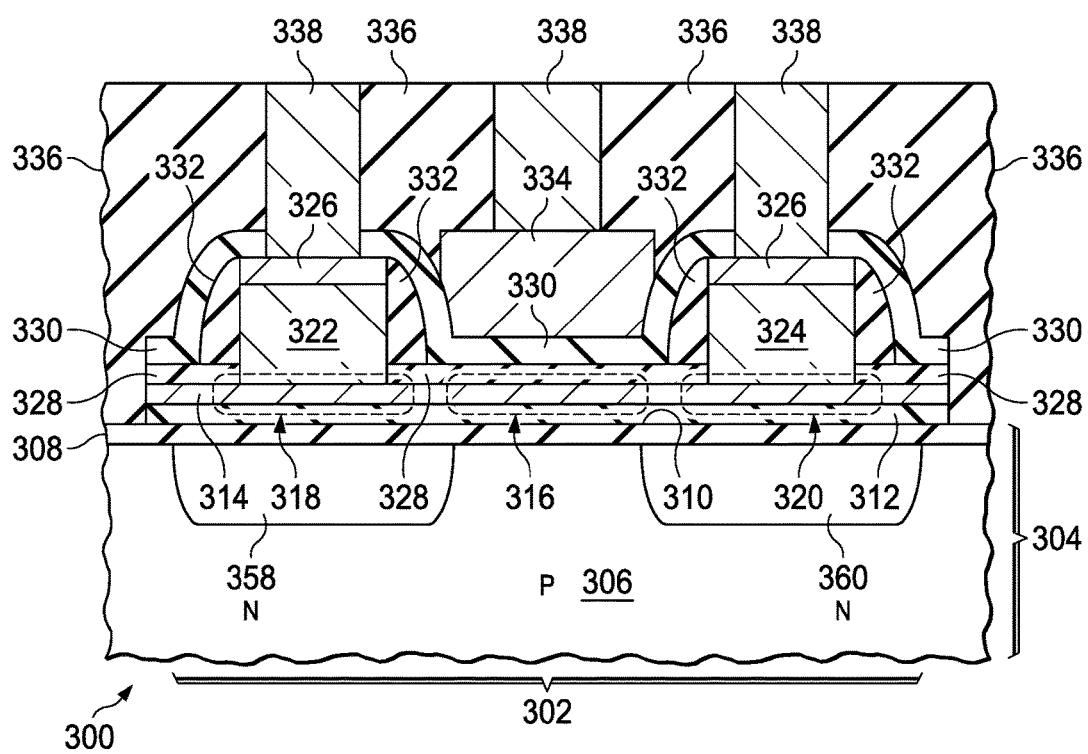
FIG. 3 is a cross section of another example microelectronic device which includes a gated graphene component.

FIG. 3 is a cross section of another example microelectronic device 300 which includes a gated graphene component 302. The microelectronic device 300 includes a substrate 304. The substrate 304 of the instant example may be a portion of a semiconductor wafer, for example, a single crystal silicon wafer, possibly with an epitaxial layer, or an SOI wafer, and includes a semiconductor material 306 having a first conductivity type, for example p-type, as depicted in FIG. 3. The substrate 304 includes a dielectric material 308 extending to a top surface 310 of the substrate 304. In the instant example, the dielectric material 308 is a dielectric layer 308 less than 30 nanometers thick, to support a desired electric field in the gated graphene component 302 from a bias in the semiconductor material 306. The dielectric material 308 may have a composition and structure similar to a gate dielectric layer of a metal oxide semiconductor (MOS) transistor, not shown, of the microelectronic device 300.

The gated graphene component 302 of the instant example includes a lower hBN layer 312 over the top surface 310, and a graphitic layer 314 over the top surface 310. The graphitic layer 314 includes one or more layers of graphene. The graphitic layer 314 includes a channel region 316, a first contact region 318 adjacent to the channel region 316, and a second contact region 320 adjacent to the channel region 316, and the graphene extends from the channel region 316 into the first contact region 318, and from the channel region 316 into the second contact region 320.

The substrate 304 of the instant example includes a first contact field region 358 of semiconductor material having a second, opposite, conductivity type from the semiconductor material 306. The first contact field region 358 is located below the dielectric material 308 and under the first contact region 318 of the graphitic layer 314. In a version of the instant example depicted in FIG. 3, the first contact field region 358 is n-type. The substrate 304 of the instant example also include a second contact field region 360 of semiconductor material having the second conductivity type. The second contact field region 360 is located below the dielectric material 308 and under the second contact region 320 of the graphitic layer 314. The first contact field region 358 and the second contact field region 360 may be regions of the semiconductor material 306 which have been counterdoped to the second conductivity type.

A first connection 322 is disposed on the graphitic layer 314 in the first contact region 318, and a second connection 324 is disposed on the graphitic layer 314 in the second contact region 320. The first connection 322 and the second connection 324 provide electrical connections to the graphene in the graphitic layer 314. The first connection 322 and the second connection 324 may have a composition as disclosed for the first connection 122 and the second connection 124 of FIG. 1. Barrier caps 326 may be disposed over the first connection 322 and the second connection 324. The barrier caps 326 may include material which inhibits diffusion of nitrogen and boron. The first connection 322 is located over the first contact field region 358, and the second connection 324 is located over the second contact field region 360.

The gated graphene component 302 includes a patterned hBN layer 328 on the graphitic layer 314 over the channel region 316. The patterned hBN layer 328 does not extend completely under the first connection 322 or completely under the second connection 324. The gated graphene component 302 of the instant example includes contact spacers 332 directly adjacent to lateral surfaces of the first connection 322 and the second connection 324. The contact spacers 332 do not extend over the channel region 316. The gated graphene component 302 of the instant example includes a gate dielectric layer 330 over the patterned hBN layer 328 above the channel region 316. In the instant example, the gate dielectric layer 330 extends along the lateral surfaces of the contact spacers 332, so that the gate dielectric layer 330 is separated from the first connection 322 and the second connection 324 by the contact spacers 332. Other configurations of the contact spacers 332 and the gate dielectric layer 330, relative to the first connection 322 and the second connection 324, are within the scope of the instant example.

The gated graphene component 302 includes a gate 334 over the gate dielectric layer 330 above the channel region 316. The gate 334 may have a structure and composition as disclosed for the gate 134 of FIG. 1. The gate 334 is laterally separated from the first connection 322 and the second connection 324 by the contact spacers 332.

A dielectric layer 336 may be disposed over the gated graphene component 302 and the substrate 304. Contacts 338 may be disposed through the dielectric layer 336 to provide electrical connections to the gate 334, and to the first connection 322, and the second connection 324, through the barrier caps 326, as shown in FIG. 3.

During operation of the microelectronic device 300, the first contact field region 358 and the second contact field region 360 may be biased relative to the first connection 322 and the second connection 324, to provide a desired carrier concentration in the first contact region 318 and the second contact region 320. Current may be flowed from the first connection 322 through the graphene in the graphitic layer 314 to the second connection 324. The desired carrier concentration in the first contact region 318 and the second contact region 320 may provide a desired resistance of the graphitic layer 314. The patterned hBN layer 328 and the lower hBN layer 312, may advantageously protect the graphitic layer 314, as disclosed in reference to FIG. 1.

Figure 4A:
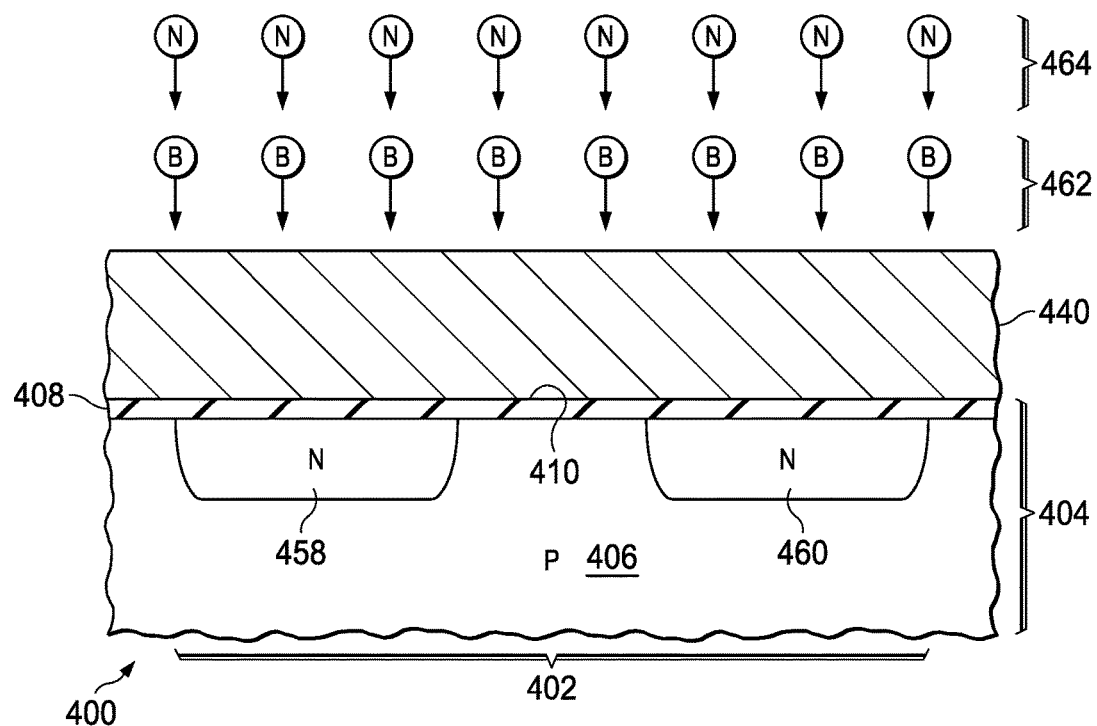
FIG. 4A through FIG. 4N are cross sections of a microelectronic device containing a gated graphene component, depicted in stages of another example method of formation.
Figure 4B:
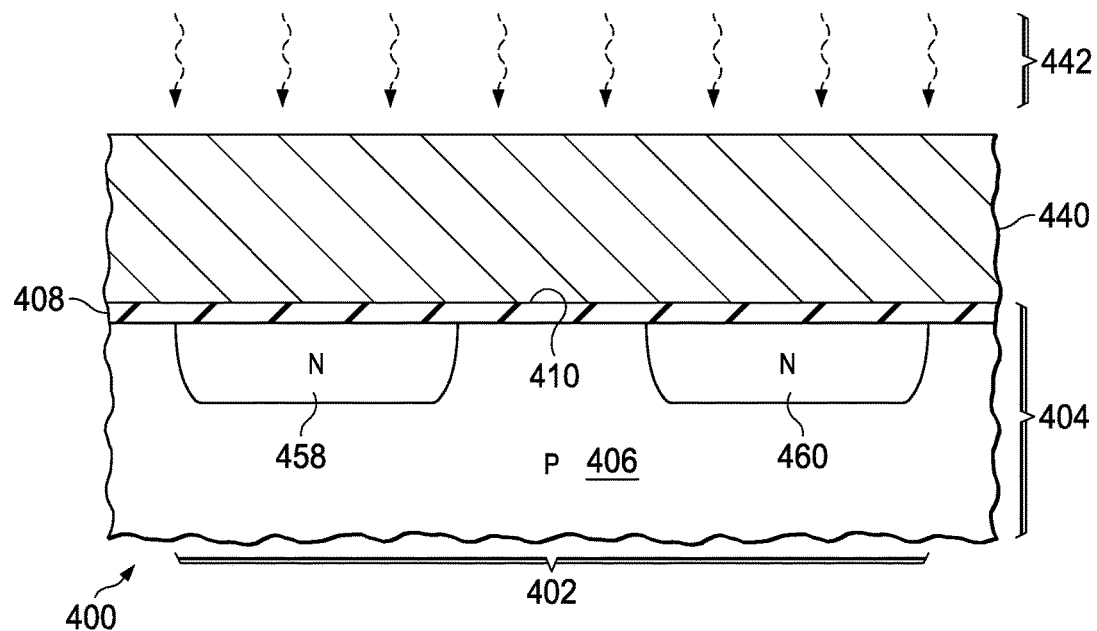
Figure 4C:
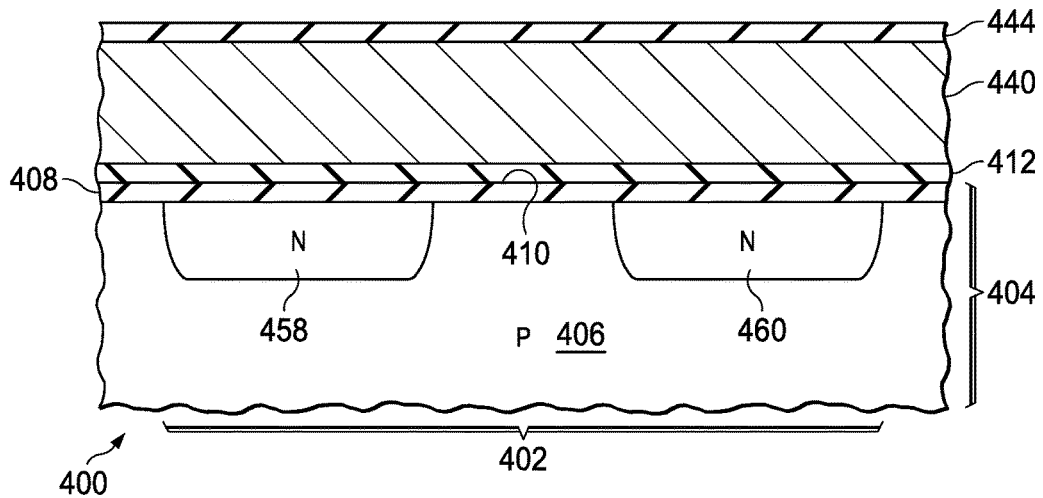
Figure 4D:
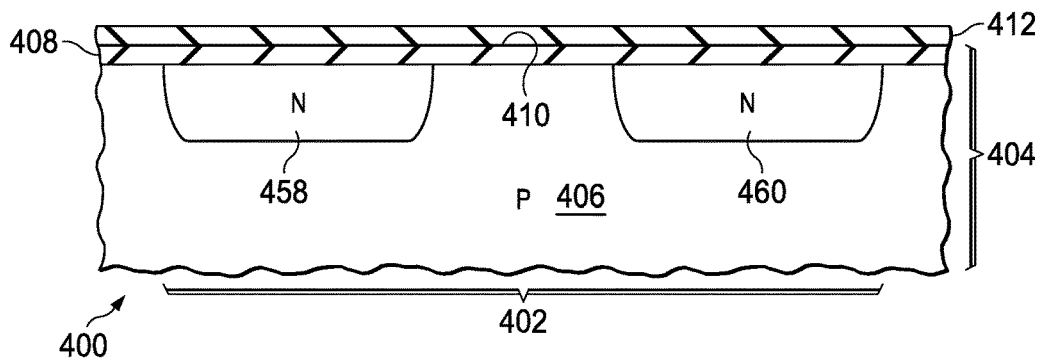
Figure 4E:
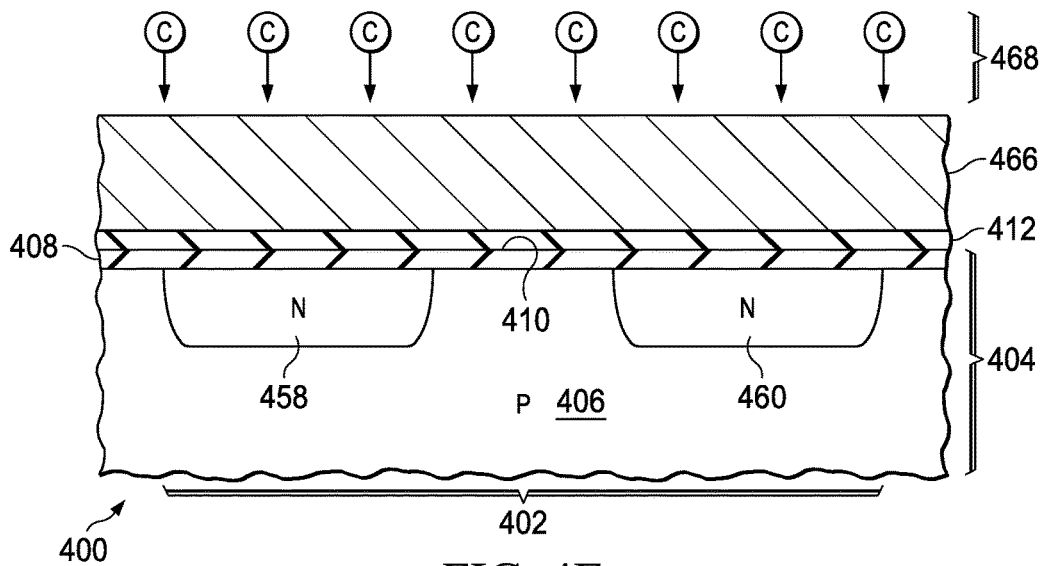
Figure 4F:
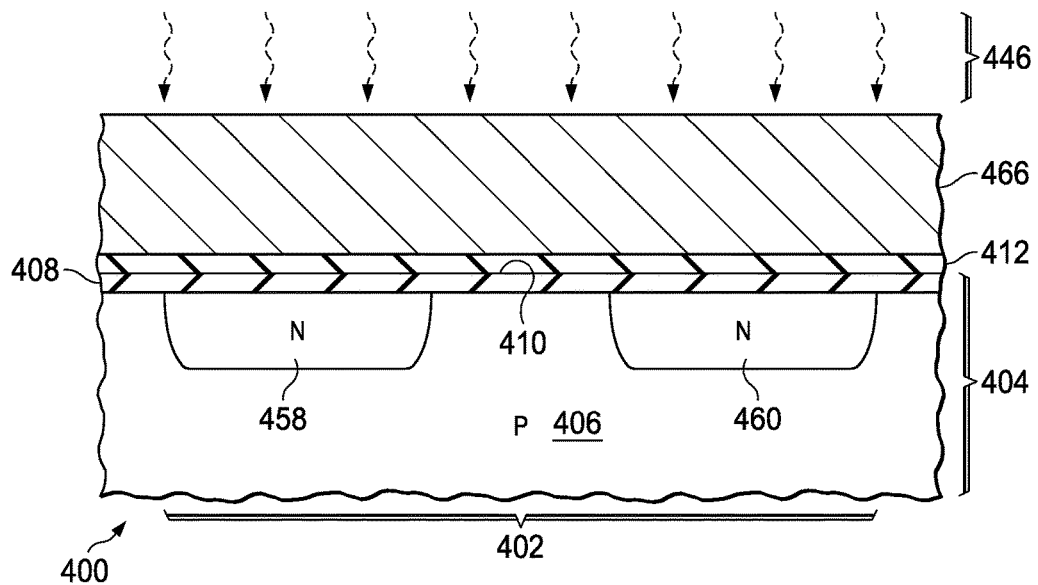
Figure 4G:
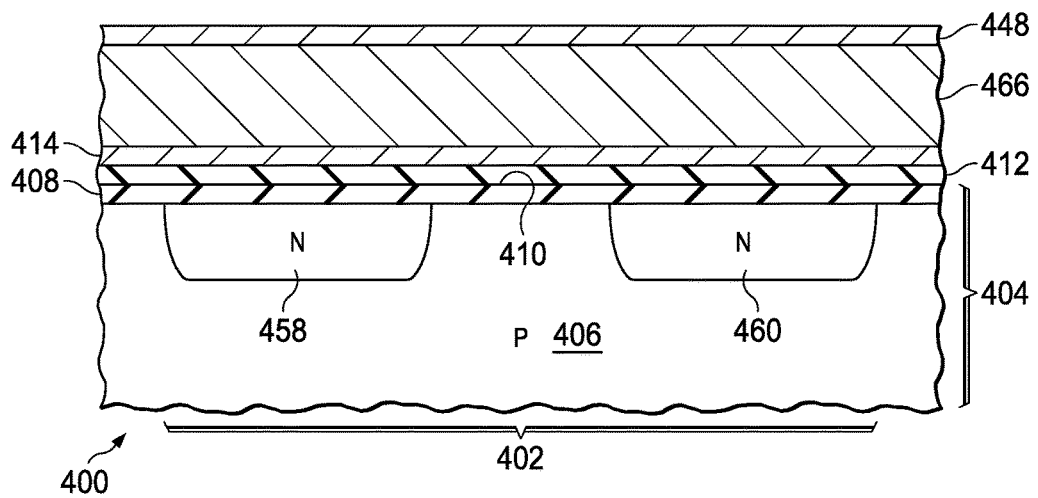
Figure 4H:
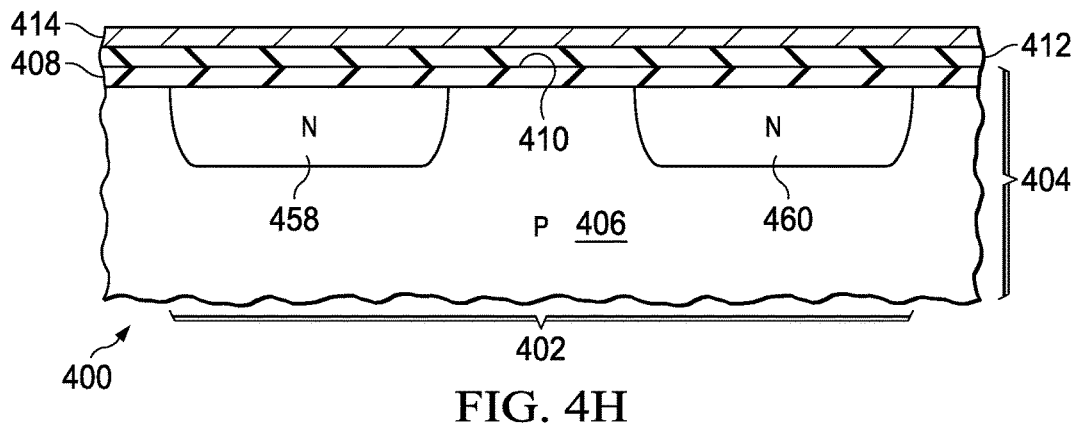
Figure 4I:
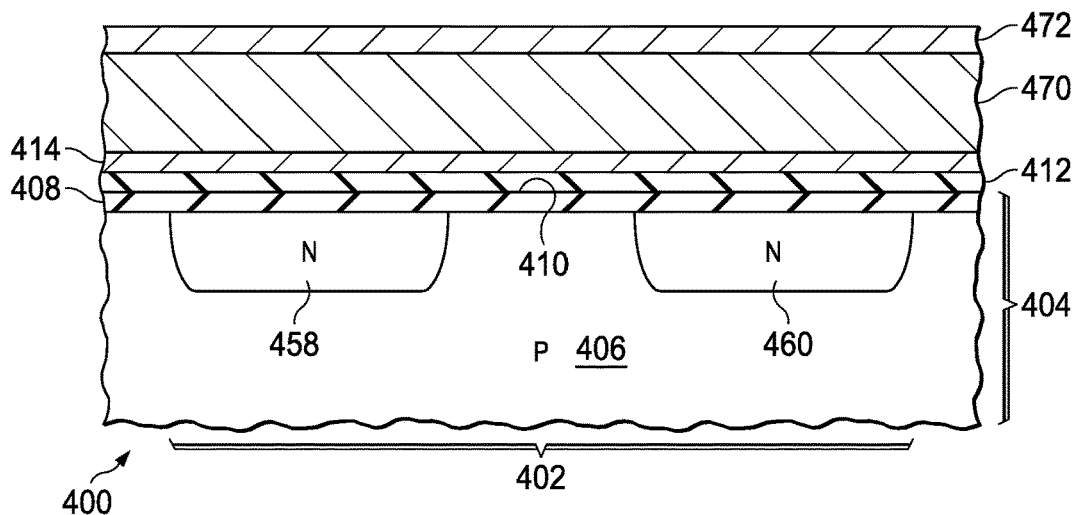
Figure 4J:
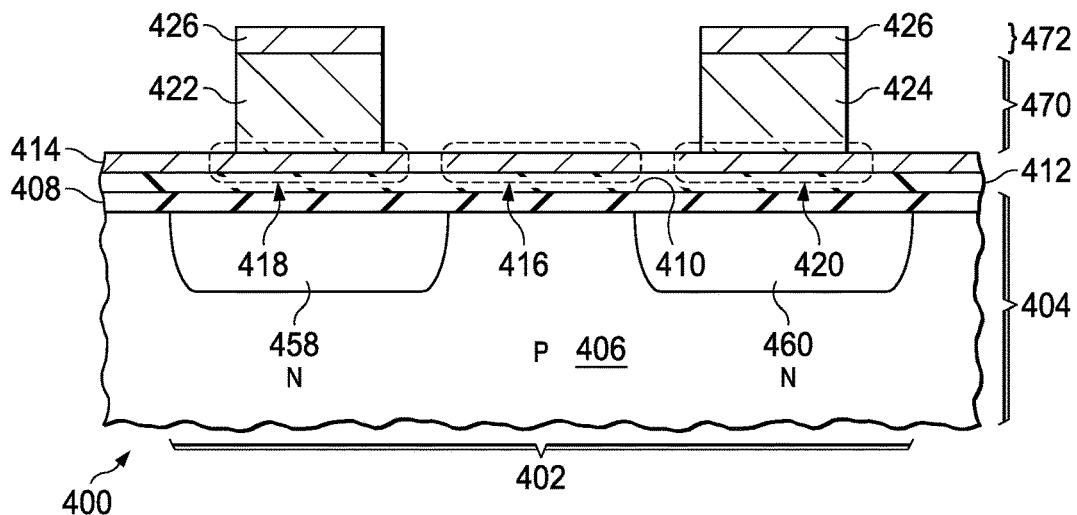
Figure 4K:
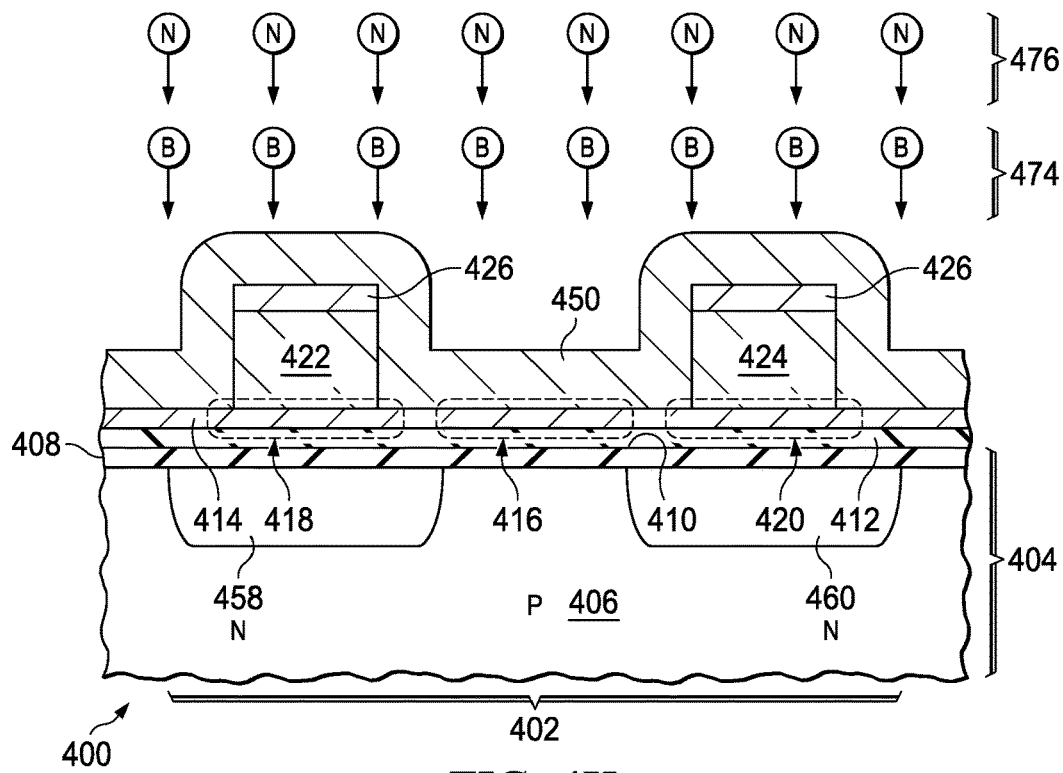
Figure 4L:
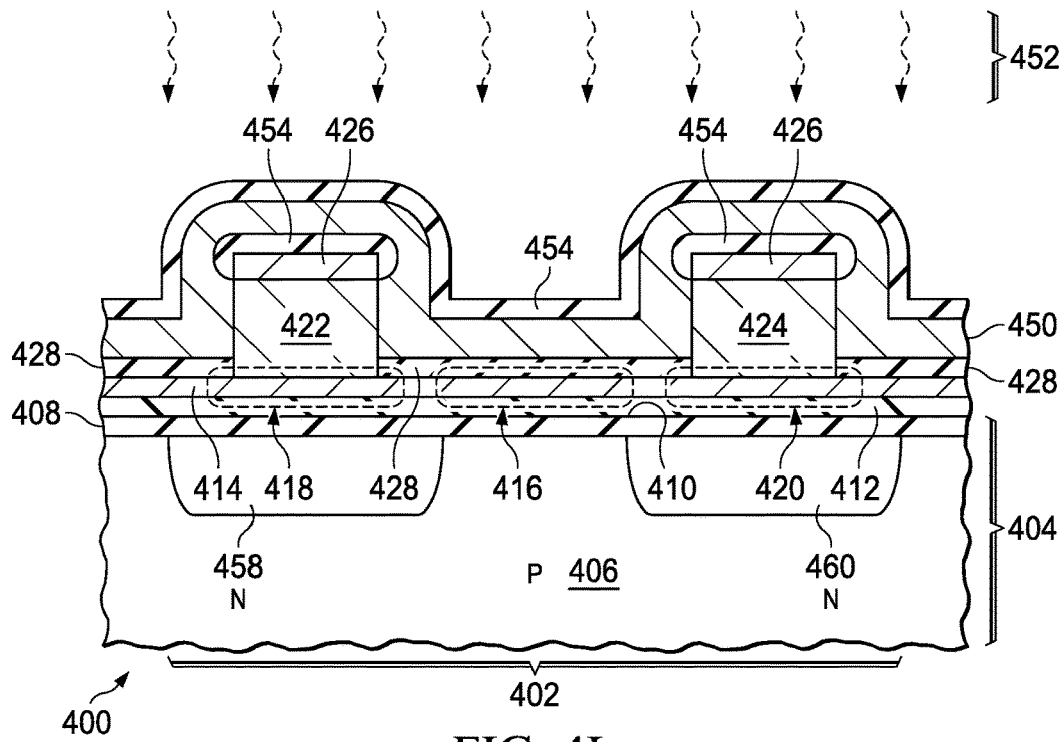
Figure 4M:
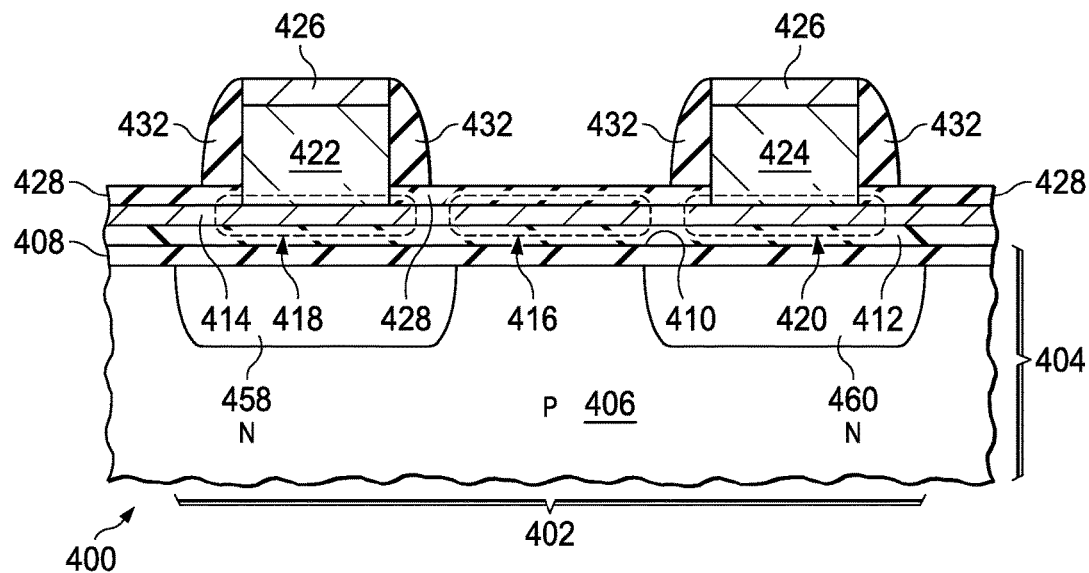
Figure 4N:
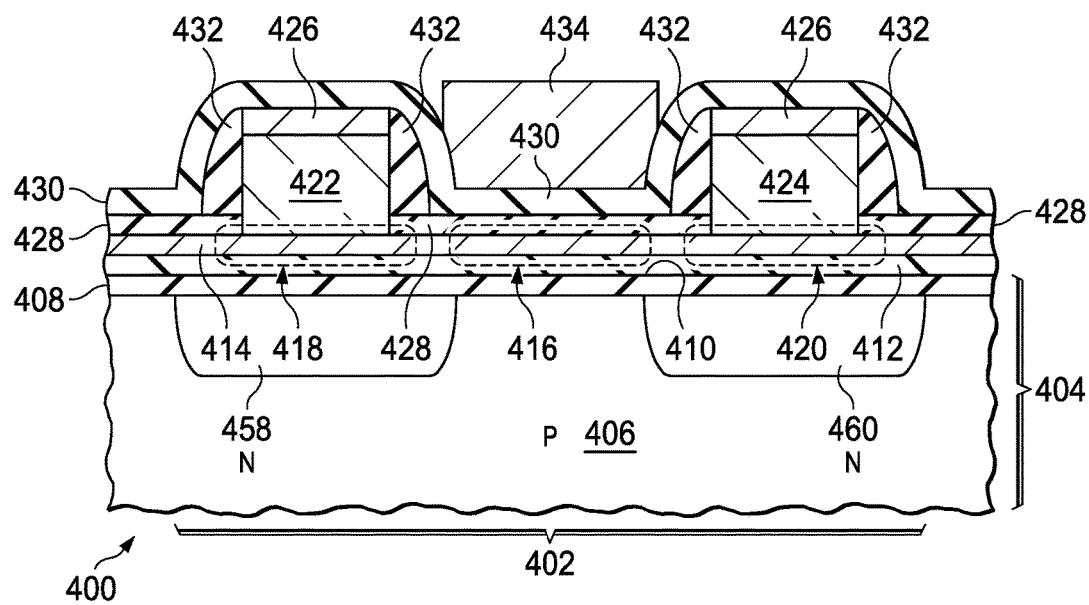

FIG. 4A through FIG. 4N are cross sections of a microelectronic device 400 containing a gated graphene component 402, depicted in stages of another example method of formation. Referring to FIG. 4A, the microelectronic device 400 includes a substrate 404 having a semiconductor material 406 such as silicon, silicon carbide, or the like, having a first conductivity type. The instant example will be described for a version in which the first conductivity type is p-type, as depicted in FIG. 4A. Other versions of the instant example in which the first conductivity type is n-type are within the scope of the instant example. The substrate 404 includes a dielectric material 408 extending to a top surface 410 of the substrate 404. In the instant example, the dielectric material 408 is a dielectric layer 408 less than 30 nanometers thick, and may be formed concurrently with a gate dielectric layer of an MOS transistor, not shown, of the microelectronic device 400.

A first metal layer 440 is formed over the dielectric material 408. The first metal layer 440 includes one or more metals suitable for subsequent precipitation of an hBN layer. The first metal layer 440 may have a structure and composition as disclosed for the lower metal layer 240 of FIG. 2A, and may be formed by a process as disclosed for the lower metal layer 240. The first metal layer 440 may extend over the top surface 410 of the substrate 404, as depicted in FIG. 4A, or may be patterned so as to extend only over an area for the gated graphene component 402.

Boron and nitrogen are introduced into the first metal layer 440 in sufficient quantities to form a saturation condition of boron and a saturation condition of nitrogen in the first metal layer 440 at a temperature suitable for diffusion of the boron and the nitrogen in the first metal layer 440 and precipitation of the hBN layer on the dielectric material 408, for example, 400° C. to 800° C. In the instant example, the boron may be introduced into the first metal layer 440 by ion implanting a first dose of boron ions 462, and the nitrogen may be introduced into the first metal layer 440 by ion implanting a first dose of nitrogen ions 464, as depicted schematically in FIG. 4A.

Referring to FIG. 4B, the first metal layer 440 is heated to dissolve the boron and nitrogen that were implanted as described in reference to FIG. 4A. The first metal layer 440 may be heated to a temperature of 400° C. to 800° C. The first metal layer 440 may be heated by a first radiant heating process 442, as depicted schematically in FIG. 4B, or by another process such as a furnace process or a hot plate process.

Referring to FIG. 4C, the first metal layer 440 is subsequently cooled, resulting in diffusion of the boron and the nitrogen to surfaces of the first metal layer 440 and precipitation of a lower hBN layer 412 on the top surface 410 of the dielectric material 408. A sacrificial hBN layer 444 may be precipitated on a top surface of the first metal layer 440, opposite from the lower hBN layer 412.

Referring to FIG. 4D, the first metal layer 440 and the sacrificial hBN layer 444 of FIG. 4C are removed, leaving at least a portion of the lower hBN layer 412 in place over the dielectric material 408. The sacrificial hBN layer 444 may be removed, for example, by a sputter etch, a plasma etch using fluorine, or a wet etch using sulfuric acid and hydrogen peroxide. The first metal layer 440 may be removed by a wet etch process to provide etch selectivity and to avoid degradation of the lower hBN layer 412. The chemistry of the wet etch process may depend on the composition of the first metal layer 440.

Referring to FIG. 4E, a second metal layer 466 is formed on the lower hBN layer 412. The second metal layer 466 includes one or more metals suitable for subsequent precipitation of a graphitic layer. The second metal layer 466 may have a structure and composition as disclosed for the lower metal layer 240 of FIG. 2A, and may be formed by a process as disclosed for the lower metal layer 240.

Carbon is introduced into the second metal layer 466 in sufficient quantities to form a saturation condition of carbon in the second metal layer 466 at a temperature suitable for diffusion of the carbon in the second metal layer 466 and precipitation of the graphitic layer on the lower hBN layer 412, for example, 400° C. to 800° C. In the instant example, the carbon may be introduced into the second metal layer 466 by ion implanting a dose of carbon ions 468, as depicted schematically in FIG. 4E.

Referring to FIG. 4F, the second metal layer 466 is heated to dissolve the carbon that was implanted as described in reference to FIG. 4E. The second metal layer 466 may be heated by a second radiant heating process 446, as depicted schematically in FIG. 4B, or by another heating process.

Referring to FIG. 4G, the second metal layer 466 is subsequently cooled, resulting in diffusion of the carbon to surfaces of the second metal layer 466 and precipitation of a graphitic layer 414 on the lower hBN layer 412. The graphitic layer 414 includes graphene and may have a Bernal configuration. A sacrificial graphitic layer 448 may also be precipitated on a top surface of the second metal layer 466, opposite from the graphitic layer 414.

Referring to FIG. 4H, the second metal layer 466 and the sacrificial graphitic layer 448 of FIG. 4G are removed, leaving at least a portion of the graphitic layer 414 in place on the lower hBN layer 412. The sacrificial graphitic layer 448 may be removed by an asher process or such. The second metal layer 466 may be removed by a wet etch process to provide etch selectivity and to avoid degradation of the graphitic layer 414. The chemistry of the wet etch process may depend on the composition of the second metal layer 466.

Referring to FIG. 4I, a contact layer 470 is formed on the graphitic layer 414. The contact layer 470 may include metal, graphite, carbon nanotubes, or other material suitable for making electrical connections to the graphitic layer 414. A barrier layer 472 may optionally be formed over the contact layer 470. The barrier layer 472 includes material which inhibits diffusion of nitrogen and boron.

Referring to FIG. 4J, the contact layer 470 and the barrier layer 472 are patterned to form a first connection 422 on the graphitic layer 414 and a second connection 424 on the graphitic layer 414, and barrier caps 426 on the first connection 422 and the second connection 424. The first connection 422 contacts the graphitic layer 414 in a first contact region 418 of the graphitic layer 414, and the second connection 424 contacts the graphitic layer 414 in a second contact region 420 of the graphitic layer 414. The first contact region 418 is adjacent to a channel region 416 of the graphitic layer 414, and the second contact region 420 is adjacent to the channel region 416. The contact layer 470 and the barrier layer 472 may be patterned, for example, by forming an etch mask over the barrier layer 472 which covers an area for the first contact region 418 and the second contact region 420, and removing the barrier layer 472 and the contact layer 470 where exposed by the etch mask. The contact layer 470 is removed over the channel region 416 so as to leave at least a portion of the graphitic layer 414 on the lower hBN layer 412 in the channel region 416.

Referring to FIG. 4K, a third metal layer 450 is formed on the graphitic layer 414 in the channel region 416. The third metal layer 450 may extend over the first connection 422 and the second connection 424, as depicted in FIG. 4K. The third metal layer 450 includes one or more metals suitable for subsequent precipitation of an hBN layer on the graphitic layer 414. The third metal layer 450 may have a structure and a composition similar to that disclosed for the lower metal layer 240 of FIG. 2A. The third metal layer 450 may be formed by any of the processes disclosed in reference to the lower metal layer 240.

Boron and nitrogen are introduced into the third metal layer 450 in sufficient quantities to form a saturation condition of boron and a saturation condition of nitrogen in the third metal layer 450 at a temperature suitable for diffusion of the boron and the nitrogen and precipitation of the hBN layer on the graphitic layer 414. In the instant example, the boron may be introduced into the third metal layer 450 by ion implanting a second dose of boron ions 474, and the nitrogen may be introduced into the third metal layer 450 by ion implanting a second dose of nitrogen ions 476, as depicted schematically in FIG. 4K.

Referring to FIG. 4L, the third metal layer 450 is heated to dissolve the boron and nitrogen that were implanted as described in reference to FIG. 4K. The third metal layer 450 may be heated by a third radiant heating process 452, as depicted schematically in FIG. 4L, or by another heating process. The barrier caps 426 block the boron and nitrogen from a major portion of the first connection 422 and the second connection 424.

The third metal layer 450 is subsequently cooled, resulting in diffusion of the boron and the nitrogen to surfaces of the third metal layer 450 and precipitation of a patterned hBN layer 428 on the graphitic layer 414 above the channel region 416, opposite from the lower hBN layer 412. A sacrificial hBN layer 454 may be precipitated on a top surface of the third metal layer 450, opposite from the patterned hBN layer 428. Additional portions of the sacrificial hBN layer 454 may be precipitated on the barrier caps 426, as depicted in FIG. 4L. Further portions of the sacrificial hBN layer 454 may possibly be precipitated on lateral surfaces of the first connection 422 and the second connection 424, depending on conditions of an interface between the upper metal layer 450 and the first connection 422 and the second connection 424.

The third metal layer 450 and the sacrificial hBN layer 454 are removed, leaving at least a portion of the patterned hBN layer 428 in place on the graphitic layer 414 above the channel region 416.

Referring to FIG. 4M, contact spacers 432 are formed adjacent to lateral surfaces of the first connection 422 and the second connection 424. In the instant example, the contact spacers 432 may be formed directly adjacent to the first connection 422 and the second connection 424. The contact spacers 432 do not extend over the channel region 416. The contact spacers 432 may be formed from a conformal spacer layer, similar to the method disclosed in reference to FIG. 2H and FIG. 2I for forming the contact spacers 232 of FIG. 2I.

Referring to FIG. 4N, a gate dielectric layer 430 is formed over the patterned hBN layer 428 above the channel region 416. The gate dielectric layer 430 may extend over the contact spacers 432, the first connection 422, and the second connection 424, as depicted in FIG. 4N. The gate dielectric layer 430 may have a composition as disclosed in reference to the gate dielectric layer 130 of FIG. 1, and may be formed by any of the processes disclosed in reference to forming the gate dielectric layer 230 of FIG. 2H. Forming the gate dielectric layer 430 after forming the contact spacers 432 may advantageously eliminate degradation to the gate dielectric layer 430 by removal of the conformal spacer layer in a method in which the contact spacers 432 are formed after the gate dielectric layer 430.

A gate 434 is formed over the gate dielectric layer 430 above the channel region 416. The gate 434 may have a structure and composition as disclosed in reference to the gate 134 of FIG. 1. The gate 434 is laterally separated from the first connection 422 and the second connection 424 by the contact spacers 432.

Various features of the examples disclosed herein may be combined in other manifestations of example integrated circuits. For example, a microelectronic device may have the contact field regions 358 and 360 of FIG. 3 in combination with the configuration of the gate dielectric layer 130 and the contact spacers 132 of FIG. 1. Similarly, a microelectronic device may have the substrate 104 and dielectric material 108 configuration of FIG. 1 in combination with the configuration of the gate dielectric layer 330 and the contact spacers 332 of FIG. 3. A method of forming a microelectronic device may combine either the method of forming the lower hBN layer 212 disclosed in reference to FIG. 2A and FIG. 2B or the method of forming the lower hBN layer 412 disclosed in reference to FIG. 4A through FIG. 4D, with either the method of forming the graphitic layer 214 disclosed in reference to FIG. 2C and FIG. 2D or the method of forming the graphitic layer 414 disclosed in reference to FIG. 4E through FIG. 4H, and with either the method of forming the patterned hBN layer 228 disclosed in reference to FIG. 2F and FIG. 2G or the method of forming the patterned hBN layer 428 disclosed in reference to FIG. 4K and FIG. 4L.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a substrate having a first semiconductor material and a dielectric material over the semiconductor material, the dielectric material extending to a top surface of the substrate;
   a gated graphene component, including:
     a graphitic layer over the dielectric material, the graphitic layer including at least one layer of graphene, the graphitic layer having a channel region, a first contact region adjacent to the channel region and a second contact region adjacent to the channel region, wherein the first semiconductor material has a first conductivity type under the channel region;
     a patterned hexagonal boron nitride (hBN) layer on the graphitic layer over the channel region; and
     a gate over the patterned hBN layer and above the channel region;
   a first connection on the graphitic layer, the first connection contacting the graphitic layer in the first contact region, wherein the patterned hBN layer does not extend completely under the first connection;
   a second connection on the graphitic layer, the second connection contacting the graphitic layer in the second contact region, wherein the patterned hBN layer does not extend completely under the second connection;
   a first contact field region of a second semiconductor material having a second, opposite, conductivity type, below the first contact region; and
   a second contact field region of a third semiconductor material having the second conductivity type, below the second contact region.

2. The microelectronic device of claim 1, further comprising a lower hBN layer under the graphitic layer, opposite from the patterned hBN layer, the graphitic layer being on the lower hBN layer.

3. The microelectronic device of claim 1, wherein the gated graphene component further includes a gate dielectric layer on the patterned hBN layer over the channel region, the gate being located over the gate dielectric layer.

4. The microelectronic device of claim 1, wherein the gated graphene component further includes contact spacers of dielectric material adjacent to lateral surfaces of the first connection and the second connection, wherein the gate is laterally separated from the first connection and the second connection by the contact spacers.

5. The microelectronic device of claim 4, wherein the contact spacers are directly adjacent to the lateral surfaces of the first connection and the second connection.

6. The microelectronic device of claim 1, further comprising barrier caps over the first connection and the second connection, wherein the barrier caps include a material which inhibits diffusion of nitrogen and boron.

7. The microelectronic device of claim 6, wherein the material which inhibits diffusion of nitrogen and boron is selected from the group consisting of titanium nitride and tantalum nitride.

8. A method of forming a microelectronic device, comprising:
providing a substrate having a dielectric material extending to a top surface of the substrate;
forming a graphitic layer including at least one layer of graphene over the substrate, the graphitic layer having a channel region, a first contact region adjacent to the channel region and a second contact region adjacent to the channel region;
forming a first connection contacting the graphitic layer in the first contact region;
forming a second connection contacting the graphitic layer in the second contact region;
forming a first metal layer on the graphitic layer;
forming a patterned hexagonal boron nitride (hBN) layer on the graphitic layer over the channel region by diffusion of boron and nitrogen in the first metal layer and precipitation from the first metal layer, so that the patterned hBN layer does not extend completely under the first connection and the patterned hBN layer does not extend completely under the second connection; and
forming a gate over the patterned hBN layer above the channel region.

9. The method of claim 8, further comprising forming barrier caps over the first connection and the second connection prior to forming the patterned hBN layer, wherein the barrier caps include a material which inhibits diffusion of nitrogen and boron.

10. The method of claim 8, wherein the first metal layer includes a metal selected from the group consisting of cobalt, nickel, copper, ruthenium, rhodium, palladium, silver, rhenium, iridium, platinum, and gold.

11. The method of claim 8, wherein precipitation of the patterned hBN layer from the first metal layer includes:
heating the first metal layer to 400° C. to 800° C.;
introducing boron into the first metal layer using a boron-containing reagent while the first metal layer is at a temperature of 400° C. to 800° C.;
introducing nitrogen into the first metal layer using a nitrogen-containing reagent while the first metal layer is at a temperature of 400° C. to 800° C.; and
subsequently cooling the first metal layer.

12. The method of claim 8, wherein precipitation of the patterned hBN layer from the first metal layer includes:
implanting boron into the first metal layer using a first ion implantation process;
implanting nitrogen into the first metal layer using a second ion implantation process;
heating the first metal layer to 400° C. to 800° C. after implanting the boron and the nitrogen; and
subsequently cooling the first metal layer.

13. The method of claim 8, further comprising forming a lower hBN layer prior to forming the graphitic layer, wherein the graphitic layer is formed on the lower hBN layer.

14. The method of claim 13, further comprising forming a second metal layer over the dielectric material of the substrate, wherein the lower hBN layer is formed by diffusion of boron and nitrogen in the second metal layer and precipitation from the second metal layer.

15. The method of claim 8, further comprising forming a third metal layer over the dielectric material of the substrate, wherein the graphitic layer is formed by diffusion of carbon in the third metal layer and precipitation from the third metal layer.

16. The method of claim 8, further comprising:
forming a second metal layer over the dielectric material of the substrate;
precipitating a lower hBN from the second metal layer; and
precipitating the graphitic layer on the lower hBN layer from at least a portion of the second metal layer.

17. The method of claim 8, further comprising forming a gate dielectric layer over the patterned hBN layer prior to forming the gate, wherein the gate is formed over the gate dielectric layer.

18. The method of claim 8, further comprising forming contact spacers of dielectric material adjacent to lateral surfaces of the first connection and the second connection prior to forming the gate, wherein the contact spacers do not extend over the channel region, and the gate is laterally separated from the first connection and second connection by the contact spacers.

19. The method of claim 18, wherein the gate spacers are formed by forming a conformal spacer layer over the first connection, the second connection, and the channel region, followed by removing the conformal dielectric layer over the channel region by an anisotropic etch process.

20. A microelectronic device, comprising:
a substrate having a first semiconductor material and a dielectric material over the first semiconductor material, the dielectric material extending to a top surface of the substrate;
a gated graphene component, including:
a graphitic layer over the dielectric material, the graphitic layer including at least one layer of graphene, the graphitic layer having a channel region, a first contact region adjacent to the channel region and a second contact region adjacent to the channel region, wherein the first semiconductor material has a first conductivity type under the channel region;
a patterned hexagonal boron nitride (hBN) layer on the graphitic layer over the channel region; and
a gate over the patterned hBN layer and above the channel region;
a first connection on the graphitic layer, the first connection contacting the graphitic layer in the first contact region, wherein the patterned hBN layer does not extend completely under the first connection;
a second connection on the graphitic layer, the second connection contacting the graphitic layer in the second contact region, wherein the patterned hBN layer does not extend completely under the second connection;
a first contact field region of a second semiconductor material having a second, opposite, conductivity type, below the first contact region, wherein the microelectronic device is free of a direct electrical connection from the first contact field region to the graphitic layer in the first contact region; and
a second contact field region of a third semiconductor material having the second conductivity type, below the second contact region, wherein the microelectronic device is free of a direct electrical connection from the second contact field region to the graphitic layer in the second contact region.

\* \* \* \* \*